United States Patent

Sita et al.

Patent Number: 5,841,380
Date of Patent: Nov. 24, 1998

[54] VARIABLE LENGTH DECODER AND METHOD FOR DECODING TWO CODES PER CLOCK CYCLE

[75] Inventors: Richard Sita, Audubon, N.J.; Edward M. Brosz, King of Prussia, Pa.

[73] Assignee: Matsushita Electric Corporation of America, Secaucus, N.J.

[21] Appl. No.: 623,651

[22] Filed: Mar. 29, 1996

[51] Int. Cl.⁶ ............................................. H03M 7/40
[52] U.S. Cl. ................................................. 341/67
[58] Field of Search .................................... 341/67

[56] References Cited

U.S. PATENT DOCUMENTS

| | | |
|---|---|---|
| 5,138,316 | 8/1992 | Konishi . |
| 5,173,695 | 12/1992 | Sun et al. . |
| 5,225,832 | 7/1993 | Wang et al. . |
| 5,245,338 | 9/1993 | Sun . |
| 5,325,092 | 6/1994 | Allen et al. . |
| 5,428,356 | 6/1995 | Ozaki . |

*Primary Examiner*—Jeffrey A. Gaffin
*Assistant Examiner*—Jason H. Vick
*Attorney, Agent, or Firm*—Ratner and Prestia

[57] ABSTRACT

Apparatus and method for determining the lengths of a plurality of variable length encoded data values included in a data stream within a single clock cycle. The apparatus includes a shifter for receiving the data stream. The shifter is responsive to a shift control signal for transmitting a subset of the plurality of variable length encoded data values. A first length decoding mechanism is coupled to receive the subset of the plurality of encoded data values. The first length decoding mechanism performs a first decoding operation to determine the length of a first one of the encoded data values in the subset. A second length decoding mechanism is also coupled to receive the subset of the plurality of encoded data values. The second length decoding mechanism performs a second decoding operation to individually determine the length of a second one of the encoded data values in the subset. The second encoded data value immediately follows the first encoded data value in the subset. The first and second decoding operations are performed simultaneously. A combined length decoder is responsive to the lengths of the first and second encoded data values for outputting a combined length of the first and second data values. A shift controller forms the shift control signal in response to the combined length of the first and second data values. The shift control signal identifies a position of a next encoded data value within the shifter. The next encoded data value immediately follows the second encoded data value. The shift controller transmits the shift control signal to the shifter.

15 Claims, 5 Drawing Sheets

VARIABLE LENGTH DECODER AND METHOD FOR DECODING TWO CODES PER CLOCK CYCLE

The present invention relates to a variable length decoder (VLD) and, in particular, to a decoder for a variable length code which is suited for decoding compressed image data.

BACKGROUND OF THE INVENTION

Recently, remarkable progress has been made in image data compression techniques. The goal of these techniques is to raise the efficiency of, for example, digital transmission and recording by encoding the image data at a lower bit rate than would be required for unencoded image data. Exemplary techniques which have been used to obtain these coding efficiencies are predictive coding and transforming coding.

In addition, further image data compression can be achieved by performing variable length encoding on the compressed code. The variable length encoding consists of varying the encoded bit width in accordance with the frequency of occurrence of the value to be encoded. Typically, values which occur with greater frequency are assigned shorter codes than values which occur with lower frequency. Thus, a smaller bit rate can be obtained as compared to fixed length coding. One example of a variable length code is a Huffman code.

Variable length code words (VLCs) are typically decoded using a look-up table (LUT). An n-bit parallel data signal is coupled to the LUT. The n-bit signal contains a variable length code word (which may be n bits in length) which is used as an address for data stored in LUT. The data stored in the LUT corresponds to the code length and the code value. The code length specifies the length of the variable length code word that has been identified in the n-bit signal. The code value is the decoded (i.e. fixed length) value of the variable length code. The outputs of the LUT are code length and code value.

In the United States a standard has been proposed for digitally encoded high definition television signals. This standard is essentially the same as the MPEG-2 standard, proposed by the Moving Picture Experts Group (MPEG) of the International Standards Organization (ISO). This standard is hereinafter referred to as "the MPEG Standard." This standard is described in a draft internal standard (DIS) publication entitled "Information Technology—Generic Coding of Moving Pictures and Associated Audio, Recommendation H.262 ISO/IEC 13818-2:1995 (E), which is available from the ISO and which is hereby incorporated by reference for its teaching on the MPEG-2 digital video encoding standard.

For an example of how the MPEG standard uses variable length coding, consider the code tables B-14 and B-15 defined in Annex B of the MPEG-2 standard. In this code table, variable length code words having a maximum size of 17 bits are to be decoded. Each code corresponds to a respectively different combination of "run" and "level" values, where the run is the number of zero coefficients preceding a non-zero coefficient, in the scan order, and the level is the absolute value of the non-zero coefficient.

MPEG-2 High Definition Television (HDTV) video decoders require a very high decoding rate. Although many fields within the compressed bitstream are variable length encoded, about 85% of the bitstream comprises discrete cosine transform (DCT) coefficient decoding. The HDTV bitstream requires decoding of on the order of 100 million variable length codes per second. Decoding a single code at a time would thus require a 100 MHz clock, which is beyond the practical limits of currently available high-density ASICs. The alternative is to decode multiple codes per clock cycle.

One method of decoding multiple codes has involved the use of two VLDs operating in tandem. The disadvantage of this approach has been that, because the data are in slice format, and the length of each slice is unknown prior to decoding, the two parallel paths must operate on separate slices, requiring preprocessing and memory to separate every other slice.

U.S. Pat. No. 5,428,356 to Ozaki is expressly incorporated by reference herein for its teachings on a VLD using a predetermined prioritized decoding arrangement. The VLD of Ozaki includes a first decoder circuit for decoding a leading Huffman code of a Huffman code string and a second decoder circuit for decoding a consecutive string of two predetermined Huffman codes from the leading portion of the Huffman code string. The first decoder uses an LUT as described above. The second decoder uses an LUT in which each one of a fixed number of predetermined code word pairs is used as an address for data stored in the LUT. The data stored in the LUT correspond to pairs of code length and code value sequences. When one of the predetermined code word pairs is encountered in the input stream, the corresponding code length pairs and code value pairs are output by the second decoder. When the second decoder outputs two decoded values, a selector selects the output of the second decoder. When the second decoder fails to produce two decoded values, the selector selects the output of the first decoder.

The VLD of the Ozaki Patent is limited in that the second decoder can only decode a limited number of predetermined two-string combinations. More specifically, the second decoder only decodes selected pairs of codes for which the pair has a short total length. Multiple clock cycles are required when strings of longer length are encountered. Because the Huffman codes are generally selected so that the low frequency codes have longer lengths, Ozaki's second decoder generally will not decode code pairs which include lower frequency codes, and multiple clock cycles are required.

Moreover, Ozaki's VLD requires a large memory because an n-bit address must be provided as an input to the LUT. In addition, each memory location in the LUT stores an z-bit code length and a v bit code value. As a result, a total of z+v bits are needed to store code length and the code value. The total number of bits required for the LUT one is $2^n * (z+v)$.

Accordingly, proposals have been made to limit the size of the conversion tables to reduce the required memory size for the conversion table. However, these techniques have resulted in a slower decoding process.

SUMMARY OF THE INVENTION

The present invention is an apparatus and method for determining the lengths of a plurality of variable length encoded data values included in a data stream within a single clock cycle.

The apparatus includes a shifter for receiving the data stream. The shifter is responsive to a shift control signal for transmitting a subset of the plurality of variable length encoded data values.

A first length decoding mechanism is coupled to receive the subset of the plurality of encoded data values. The first length decoding mechanism performs a first decoding operation to determine the length of a first one of the encoded data values in the subset.

A second length decoding mechanism is coupled to receive the subset of the plurality of encoded data values. The second length decoding mechanism performs a second decoding operation to individually determine a length of a second one of the encoded data values in the subset. The second encoded data value immediately follows the first encoded data value in the subset. The first and second decoding operations are performed simultaneously.

A combined length decoder is responsive to the lengths of the first and second encoded data values for outputting a combined length of the first and second data values.

A shift controller forms the shift control signal in response to the combined length of the first and second data values. The shift control signal identifies a position of a next encoded data value within the shifter. The next encoded data value immediately follows the second encoded data value. The shift controller transmits the shift control signal to the shifter.

DESCRIPTION OF THE EXEMPLARY EMBODIMENT

Overview

Figure 1:
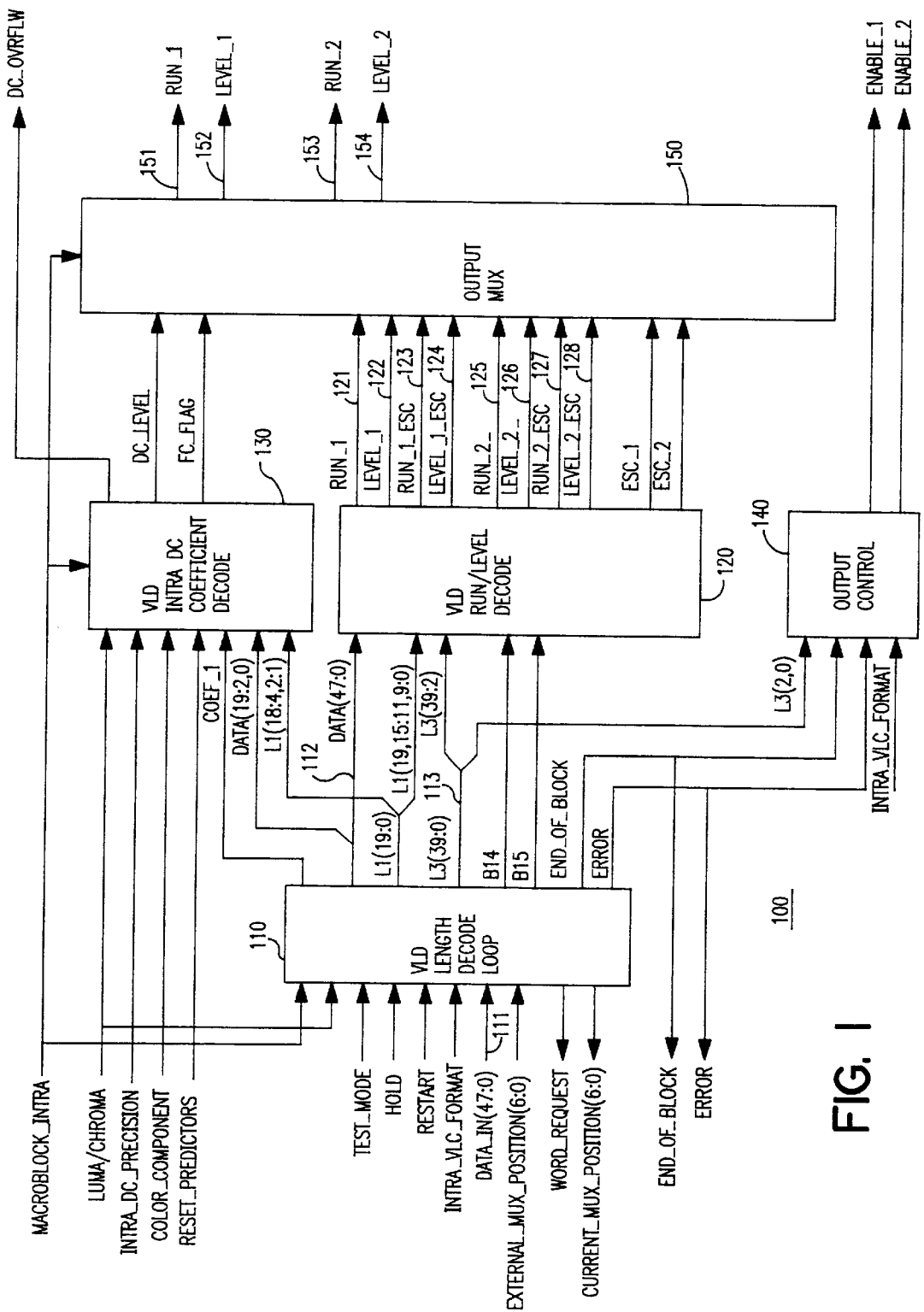
FIG. 1 is a block diagram of an exemplary Variable Length Decoder Coefficient Decoder.

FIG. 1 is a block diagram of an exemplary Variable Length Decoder (VLD) Coefficient Decoder 100 in which the present invention may be used. The present invention is an improved Variable Length Decoder (VLD) Length Decode Loop 110 capable of decoding any possible combination of two consecutive encoded data values within a single clock cycle. In the example of FIG. 1, the invention is used for decoding the length of the DCT coefficients (which make up about 85% of the encoded data stream). One of ordinary skill in the art would understand that the invention may also be used to decode other variable length encoded data values, such as the high level syntax or any other variable length coded value.

Figure 2:
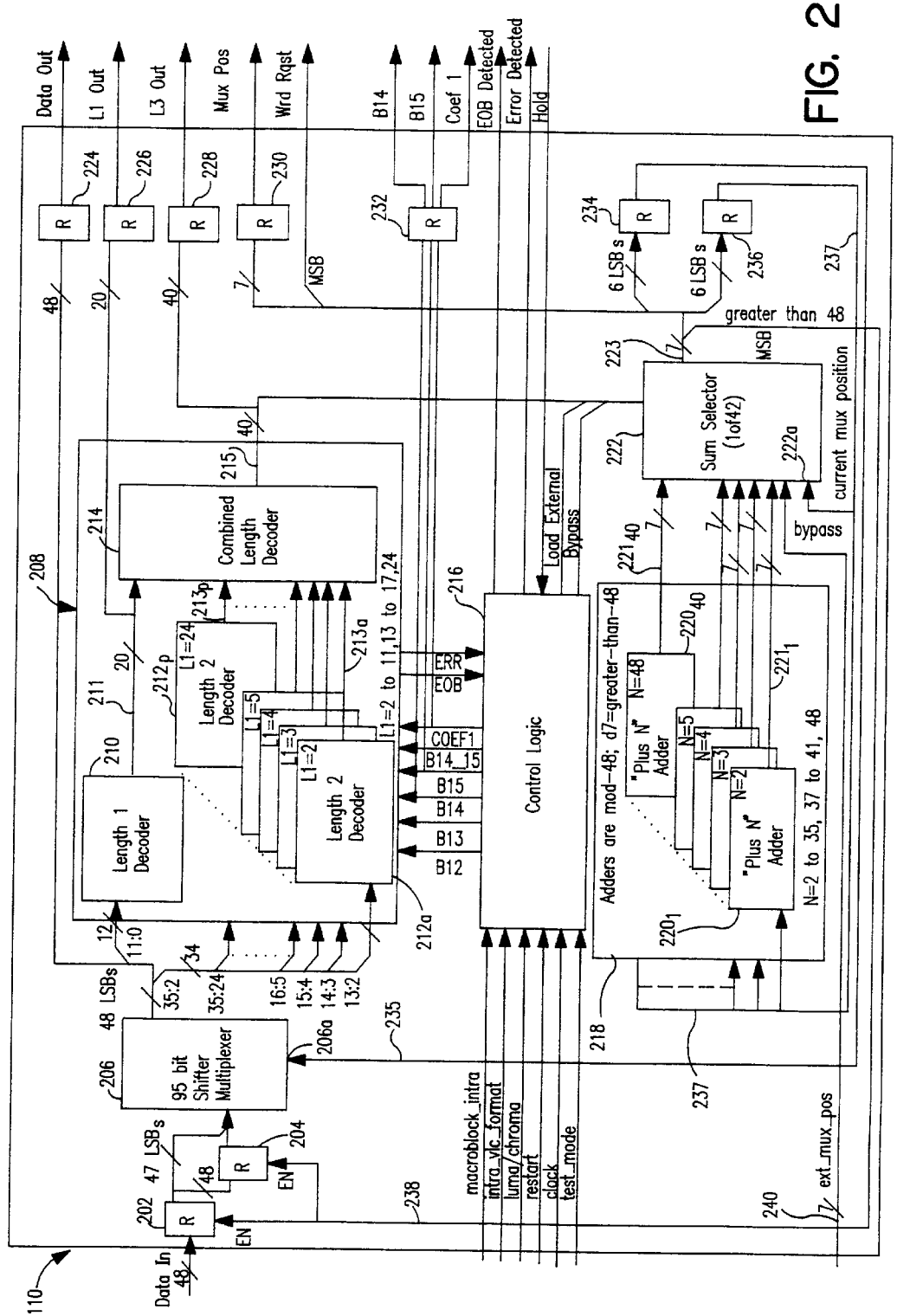
FIG. 2 is a block diagram of the VLD length decode loop of the Variable Length Decoder shown in FIG. 1.

FIG. 2 is a block diagram of the VLD Length Decode Loop 110 shown in FIG. 1. The exemplary Length Decode Loop apparatus 110 includes shifter 206 for transmitting variable length encoded data values to a first length decoder 210. First length decoder 210 performs a first decoding operation to determine a length 211 of a first one of the encoded data values.

A second length decoding mean 212 is coupled to receive the encoded data values from shifter multiplexer 206 for performing a second decoding operation, to individually determine a length of a second encoded data value which immediately follows the first encoded data value. The first and second decoding operations are performed simultaneously. The second length decoding means 212 includes a plurality of decoders 212a–212p, one decoder for each respective possible length of the first encoded data value. Each decoder 212a–212p simultaneously determines a length 213a–213p of the second encoded data value, each assuming a respectively different length of the first encoded data value. Then combined length decoder 214 uses the actual decoded length 211 of the first data value to select one of the decoded lengths 213a–213p output by decoders 212a–212p and output a combined length signal L3.

A shift controller, including blocks 218, 222, 234, and 236, is coupled to the receive the combined length from the combined length decoder 214, for forming a shift control signal 235 used to determine which of the plurality of encoded data values are transmitted to the first and second length decoding means. The shift control signal 235 is transmitted to the shifter 206.

Further details of the exemplary VLD Length Decode Loop 110 are set forth in detail below, with reference to FIG. 2.

DETAILED DESCRIPTION

A working knowledge of Recommendation H.262 ISO/IEC 13818-2: 1995 (E), "Information Technology—Generic Coding of Moving Pictures and Associated Audio Information: Video" (hereinafter referred to as "the MPEG standard"), is assumed, and is not repeated herein.

Referring again to FIG. 1, a VLD Length Decode Loop 110 receives the 48 bit compressed input data stream DATA_IN 111, which contains the encoded data. Additional input signals (MACROBLOCK_INTRA, LUMA/CHROMA, INTRA_VLC_FORMAT, TEST_MODE, HOLD, RESTART, and EXTERNAL_MUX_POSITION) provided to VLD Length Decode Loop 110 are described in greater detail below with reference to FIG. 3. The MACROBLOCK_INTRA flag is defined in paragraph 6.3.17.1 and Tables B-2 through B-8 of the MPEG standard; the LUMA/CHROMA flag indicates whether the received block is a luminance or chrominance block; and the INTRA_VLC_FORMAT is specified in the Picture Coding Extension, as specified in paragraph 6.2.3.1 of the MPEG standard.

VLD Length Decode Loop 110 determines the lengths of two consecutive encoded data values during each clock cycle. The length of the first encoded data value is indicated by L1, and the combined length of the first and second encoded data values is indicated by L3. A subset 112 of the input data 111 and the decoded length values L1 and L3 are transmitted to the VLD Run/Level Decode block 120, the VLD Intra DC Coefficient Decode block 130, and the Output Control block 140.

VLD Length Decode Loop 110 provides B14 and B15 signals to the VLD Run/Level Decode function 120, identifying which LUT to use in the Run/Level decoding. The B14 signal indicates that the DCT Coefficients Table Zero LUT (as specified in the MPEG Standard, Annex B, Table B-14 ) is used. The B15 signal indicates that the DCT Coefficients Table One information (as specified in the MPEG Standard, Annex B, Table B15 ) is used. The latter tables are hereinafter referred to as, "Table B-14 " and "Table B-15" respectively. The B-14 and B-15 tables specify the run and level for each VLC (except escape coded values, for which the run and level are specified by Table B-16.

When the decoded value of a coefficient (identified in Table B-14 or B-15) is the "End of Block" sequence, there are no more coefficients in the block. VLD Length Decode Loop 110 detects the End of Block sequence and provides an END_OF_BLOCK signal to the Output Control function 140.

VLD Run/Level Decode block 120 receives the input data, lengths L1 and L3, Table B14 and Table B15. VLD Run/Level Decode block 120 uses this information to determine decoded values. For DCT coefficients other than the DC intra coefficient, VLD Run/Level Decode block 120 determines the Run and Level (as defined in the MPEG standard, paragraphs 3.79 and 3.119) for each of the two VLC's in the input data. These values are designated RUN__1, LEVEL __1. RUN__2 and LEVEL__2, respectively. The determination of the decoded values are based on either Tables B14 or B15, the applicable table for any given block being determined in accordance with Table 7-3 of the MPEG Standard.

Many possible combinations of run and level have no variable length code (VLC) to represent them. To encode these statistically rare combinations, an Escape Coding method is used, as specified in the MPEG Standard, paragraph 7.2.2.3. According to this method, an escape VLC is followed by a 6-bit fixed length code corresponding to the run value, which is then followed by a 12 bit fixed length code giving the value of the signed level. If the encoded data value includes the "Escape Code," then VLD Run/Level Decode block 120 provides run and level values as defined in the MPEG Standard, Annex B, Table B-16. The detection of an Escape Code is indicated in FIG. 1 by the signals ESC__1 and ESC__2, and the decoded values are given by the variables, RUN__1__ESC, LEVEL__1__ESC, RUN__2__ESC, LEVEL__2__ESC. Note that the escape code is still a VLC, and an escape code appears in each of the B14 and B15 LUTs; although the run and level values for escape coded values have fixed lengths, the escape code preceding the run and level is a VLC.

In the exemplary Coefficient Decoder, a separate VLD Intra DC Coefficient Decode function 130 decodes the first VLC of an intra coded block (i.e., the DC coefficient, for which the frequency is zero in both dimensions). When the first VLC in a block is received by VLD Length Decode Loop 110, the COEF__1 output signal is set. When both COEF__1 and MACROBLOCK__INTRA are set, VLD Intra DC Coefficient Decode function 130 is enabled. VLD Intra DC Coefficient Decode function 130 decodes DC coefficient using selected data and the length of the first encoded data value provided by length decode loop 110. The dct__dc__size values decoded by the VLD Intra DC coefficient Decode function 130 are specified in the MPEG Standard, Annex B, Tables B-12 and B-13. If the block is a luminance block, the dct__dc__size values in Table B-12 are used. If the block is a chrominance block, the dct__dc__size values in Table B-13 are used.

If the decoded value of dct__dc__size is not zero, then the VLC is followed by a fixed length code, dc__dct__differential. The length of dc__dct__differential is dc__dct__size bits long. A differential value is first recovered from the coded data. The differential value is added to a predictor to recover the final decoded coefficient. One of ordinary skill in the art can readily construct an Intra DC Coefficient Decode function 130.

An Output Controller 140 receives two of the combined length bits L3 (113), and the END__OF__BLOCK and ERROR signals from VLD Length Decode Loop 110. Also, Output Controller 140 receives the INTRA__VLC__FORMAT signal. The Output Controller 140 generates two signals, ENABLE__1 and ENABLE__2, which indicate when the RUN and LEVEL signals contain valid information. The Output Controller 140 sets the ENABLE__1 and ENABLE__2 signals at the beginning of a block and resets the ENABLE__1 and ENABLE__2 signals at the end of the block. Depending on which table (B14 or B15) is used (indicated by INTRA__VLC__FORMAT) and whether L3(0) or L3(2) is set when the END__OF__BLOCK occurs, the Output Controller 140 determines if the last code of the block is in RUN__1/LEVEL__1 or RUN__2/LEVEL__2. If an error is detected (the ERROR signal is set logic high) then ENABLE__1 and ENABLE__2 are reset.

The output signals from the VLD Run/Level Decode block 120 and the Intra DC Coefficient Decode function 130 are provided to an output mux 150. The output mux 150 uses the ESC__1 signal to select either the RUN__1 and LEVEL__1 values (121 and 122) or the RUN__1__ESC and LEVEL__1__ESC values (123 and 124). Similarly the output mux 150 uses the ESC__2 signal to select either the RUN__2 and LEVEL__2 values (125 and 126) or the RUN__2__ESC and LEVEL__2__ESC values (127 and 128). The selected values are output as RUN__1 value 151, LEVEL__1 value 152, RUN__2 value 153, and LEVEL__2 value 154. Also, the FC__FLAG and MACROBLOCK__INTRA signals select the DC__LEVEL in the case of the first coefficient for Intra Coded blocks (i.e., the DC coefficient). The Output Mux 150 transmits the DC coefficient on the RUN__1/LEVEL__1 channel.

FIG. 2 is a block diagram of an exemplary embodiment of the VLD Length Decode Loop 110.

A shifting mechanism is provided for receiving the data stream DATA__IN. In the exemplary embodiment, the shifting mechanism includes a shifter-multiplexer 206 and two registers 202 and 204. The shifter multiplexer 206 is responsive to a shift control signal 235 for transmitting a subset of the plurality of variable length encoded data values for length decoding.

Each register 202 and 204 is sized to store two VLCs of the longest possible length. In the exemplary embodiment, the longest possible VLC is 24 bits long, so each register holds 48 bits. Shifter multiplexer 206 holds as many bits as registers 202 and 204 combined (less one). Exemplary register 202 receives 48 bits of new data, and outputs the received data to register 204 and to shifter multiplexer 206. Thus, register 204 is always one cycle behind register 202. When the contents of registers 202 and 204 are transmitted to register 206, the contents of register 202 are shifted down into register 204, a new 48 bits are transmitted to register 202, and both are transmitted to shifter-multiplexer 206. The result is that when registers 202 and 204 are enabled to shift in a new 48 bit word, they implement a 48 bit downward shift of the contents of shifter-multiplexer 206. This occurs when 48 or more of the 95 bits currently stored in shifter multiplexer 206 have already been transmitted to the length decode function 208 (causing transmission of a "greater than 48" signal 238 to enable registers 202 and 204, as explained below). Exemplary shifter multiplexer 206 transmits a 48 bit subset of its contents to a dual length decode function 208.

The length decoder function 208 includes both first and second code length decoding means. In the exemplary embodiment, the first length decoding means is a conventional decoder circuit 210 coupled to receive the subset of the plurality of encoded data values from shifter multiplexer 206. The decoder 210 performs a first decoding operation to determine the length of the first one of the encoded data values in the subset.

Because of the way the coefficients are encoded in Tables B-14 and B-15, only (at least one and) at most 12 bits are needed to determine the length of the VLC (even for a 24 bit long code). Thus, in the case in which the first code is a 24 bit code, and the second code is a 17 bit code, it is necessary to process 36 bits to determine both lengths. In this case, the first 6 bits identify the length of the first code, and the 25th through 36th bits identify the lengths of the second code. In the exemplary embodiment, the registers are loaded so that the codes are decoded LSB to MSB; and (at most) 12 LSBs of each VLC are used to identify the length of the VLC.

The decoder circuit 210 may, for example, include a read only memory (ROM), a programmable logic array (PLA), a logic gate or the like (not shown). Of the m bits within the input string that form the first encoded value, the first n bits, (n<m, both n and m being integers) are used to determine the length of the code. For example, if m equals 24 and n equals 12, the first 12 bits may indicate the length of the code, and the remaining bits may define the code and sign.

The decoder 210 decodes the length of both DC coefficients and AC coefficients. DC coefficient lengths are decoded using either the B12 (luminance) or B13 (chrominance) LUT, and AC coefficients are decoded using either the B14 LUT (for non intra-coded blocks, and for intra-coded blocks having intra_vlc_format equals zero) or the B15 LUT (for intra-coded blocks having intra_vlc_format equals one). Therefore, decoder 210 requires signals B12, B13, B14, B15, B14–B15, COEFF_1 from the control logic 216 to determine which look-up table to use for whichever coefficient is currently being decoded. These signals configure decoder 210 to use the appropriate LUT.

The decoder circuit 210 stores codes which correspond to the n bits used to determine the length. When the first portion (up to n bits long) of the subset of the encoded data values becomes coincident with a code stored in decoder circuit 210, the decoder 210 outputs a hit signal 211 identifying the length of the first encoded value.

The first length decoder 210 outputs a respective bit for each possible length of the first encoded data value. A single one of the bits output by the length decoder 210 is set to a value of one. The set bit corresponds to the length of the first encoded data value determined by the first length decoder 210. The twenty bit signal 211 is output from VLD Length Decode Loop 110 as the signal L1 in FIG. 2.

In the exemplary embodiment, the first variable length code may have twenty different length values corresponding to respective values from two to twenty or the value twenty-four. These possible lengths are determined by Tables B12–B15 of the MPEG Standard. Length signal 211 is a twenty bit signal, each bit corresponding to a respective one of the twenty possible lengths of the encoded value. Nineteen of the bits in signal 211 have a value of zero, and one of the twenty bits, corresponding to the decoded length of the first code, is set to one. The advantage of this form for output signal 211 is that the output signal 211 does not require any decoding. The single set bit of output signal 211 can be used as an enable signal without any further decoding, as explained below.

In the exemplary embodiment, it is not necessary to decode 21 bit long DC coefficients, because the exemplary apparatus is used in a main profile MPEG-2 decoder, and thus 21 bit codes are not encountered in the bitstream. One of ordinary skill in the art would recognize that, for other types of data streams, different code lengths may be encountered, and the first length decoder would accommodate whatever additional lengths are required in the appropriate LUT.

A second length decoding means 212 is coupled to shifter-multiplexer 206 to receive the subset of the plurality of encoded data values. The second length decoding means 212 include a respective length decoder 212a–212p for each possible length of the first encoded data value. Each length decoder 212a–212p simultaneously decodes a respectively different portion of the subset of the plurality of encoded data values. The second length decoding means 212 performs a second decoding operation to individually determine a length of a second one of the encoded data values in the subset, which immediately follows the first encoded data value in the subset. The first and second decoding operations are performed simultaneously.

As defined herein, the term, "individually determine" means that the length of the second code is determined by handling the second code as a separate code from the first code. The first code length is determined by the first decoder 210 and the second code length is determined by the second length decoding means 212. Thus, the first and second codes are not joined into one double length code for decoding purposes, as described in U.S. Pat. No. 5,428,356 (wherein each double length code is decoded in a single table look-up operation by a single decoder to identify a predetermined pair of decoded values).

For example, in the exemplary embodiment, the first code may be 2–20 or 24 bits long. The bits in the subset are ordinally numbered 0 through 47. Decoder 212a attempts to decode the length of a string that begins with the third bit (bit No. 2) in the subset of data values, which is the first bit of the second encoded data value if, and only if, the length of the first variable length code is two. Decoder 212b attempts to decode a string that begins with the fourth bit (bit No. 3) in the subset of data values, which is the first bit of the second encoded data value if, and only if, the length of the first variable length code is three. The various decoders 212c–212r correspond to successive lengths of the first encoded value, as one of ordinary skill in the art readily recognizes. Decoder 212s attempts to decode a string that begins with the 21st bit (bit No. 20) in the subset of data values, which is the first bit of the second encoded data value if, and only if, the length of the first variable length code is 20. Lastly, decoder 212p attempts to decode a string that begins with the 25th bit (bit No. 24) in the subset of data values, which is the first bit of the second encoded data value if, and only if, the length of the first variable length code is the maximum possible length, i.e., 24.

In the exemplary embodiment of FIG. 2, during the cycle when the first decoder 210 is processing an Intra DC coefficient, only one code length is processed. The first and second AC coefficients are decoded in the cycle following the cycle in which the DC coefficient is decoded. The advantage of this design is that length decoding function 208 does not have to decode both a DC and an AC coefficient during the same clock cycle. Thus the second length decoding means 212 need only include a respective decoder 212a–212p for each of the 16 possible AC coefficient lengths. It is not necessary to provide additional decoders 212q–212t for the four lengths (12, 18, 19 and 20 bits) that occur in DC coefficients but not in AC coefficients. One of ordinary skill would understand that, in an alternative embodiment (described below with reference to FIG. 5), decoding function 508 can decode the Intra DC coefficient in length decoder 510 at the same time that the first AC coefficient is decoded in second length decoder 512; that embodiment does, however, require additional decoders in the second length decoding means.

Referring again to FIG. 2, because the second encoded coefficient for the block can never be the DC coefficient, decoders 212a–212p need only use the B14 and B15 LUTs for AC coefficients. The decoders 212a–212p are configured (to apply the appropriate LUT) by the B14, B15, and B14–B15 signals received from the control logic 216.

According to one aspect of the invention, each length decoder 212a–212p simultaneously determines a respective value of the length of the second encoded data value, based on a corresponding possible length of the first encoded data value. Only one of these lengths determined by decoders 212a–212p is the correct length of the second value. To eliminate the delay which was encountered in the prior art (waiting to decode the length of the first encoded value to determine where to start the decoding of the second value), the present invention determines all of the possible lengths of the second value at the same time, simultaneously with the decoding of the length of the first value (Each possible length of the second code is based on a respectively different possible length of the first code). Then the decoded length of the first value is used to select the correct one of the decoded second length values that has already been generated.

By using the single set bit of signal 211 as an enable bit, combined length decoder rapidly enables transmission of the output of a single one of the decoders 212a –211p, without any further decoding of the first length. One of ordinary skill in the art could readily construct the logic within combined length decoder for selecting one of the second length decoders 212a–212p.

Each of the length decoders 212a–212p of the second length decoding means generates a respective output signal 213a–213p representing a length of the second encoded data value determined by the length decoder 212a–21$^2$p. In the exemplary embodiment, each of the output signals 213a–213p is a 16 bit signal, corresponding to the 16 possible lengths (2–11, 13–17 and 24) of the second encoded value. Lengths 12 and 18–20 are only used for the DC coefficient, and thus never correspond to the length of the second encoded value. The 16 bit signal includes fifteen zeroes and a single one, similar to the twenty bit signal Output by the first decoder 210.

The combined length decoder 214 uses the single set bit of signal 211 (the first length indicating signal) to enable transmission of one of the output signals 213a–213p by the corresponding one of the length decoders 212a–212p. The one enabled Output signal is the output signal of the decoder corresponding to the length of the first encoded data value for which the bit in signal 211 is set. In other words, the combined length decoder 214 is responsive to the first length signal 211 for selecting an output signal of one of the length decoders 212a–212p. The length decoder (one of decoders 212a–212p) having the selected output signal (one of signals 213a–213p) is the length decoder which corresponds to the length of the first encoded data value indicated by the first length signal 211. The selected output signal indicates the actual length of the second encoded data value.

For example, consider the case in which the first encoded value is three bits long and the second encoded value is 17 bits long. If the length of the first code is three, then the value of the second bit of signal 211 is set to one, and all of the first and third through twentieth bits of signal 211 have a value of zero. At the same time that the first value is decoded, decoder 212a tries to decode the length of the second encoded value, assuming (incorrectly) that the length of the first encoded value is two; decoder 212b decodes the length of the second encoded value, assuming (correctly) that the length of the first encoded value is three, and so forth. Combined length decoder 214 uses the set (second) bit of signal 211 to enable transmission of the output signal of decoder 212b (the second one of the decoders 212a–212p in the second decoding means 212). The enabled output signal 213b has 16 bits. In this case, in which the length of the second encoded value equals 17, the value of the 15th bit of the output signal 213b is set to one, and the values of the 1st–14 th bits and the 16th bit of signal 213b are set to zero.

In the exemplary embodiment, combined length decoder 214 outputs a forty bit signal 215. The possible lengths of the first encoded value (2–11, 13–17 and 24 for AC coefficients in the embodiment of FIG. 2) can be combined with the possible lengths of the second encoded value (2–11, 13–17, and 24, as defined in Tables B14 and B15 of the MPEG Standard) to yield 40 different combined lengths, corresponding to the combined lengths 2–35, 37–41 and 48. One of the forty bits is set, identifying the combined length of the first and second encoded values. The values of the other 39 bits of signal 215 are all set to zero. The forty bit output signal L3 identifies the combined length of the two encoded data values. The L1 and L3 signals are transmitted to the VLD Run/Level Decode function 120 (shown in FIG. 1).

The VLD Length Decode Loop also includes a shift controlling mechanism (including functions 218, 222, 234 and 236) coupled to receive the combined length 215 of the first and second encoded data values. The shift control mechanism forms the shift control signals 235 to determine which encoded data values are included in the subset that is transmitted to the length decode function 208, and transmits the shift control signals 235 to the shifter-multiplexer 206. The shift control mechanism also forms and transmits a shift enable signal 238 to registers 202 and 204 to load new data into shifter-multiplexer 206 from time to time, to maintain sufficient encoded data "in the pipeline" in shifter-multiplexer 206 to avoid interruptions in the length decoding.

Two registers 234 and 236 of the shift control mechanism are provided with the six least significant bits (LSBS) of a location in shifter-multiplexer 206. These LSBs indicate a bit position between 1 and 48 at which the LSB of the first encoded data value is located.

The value in register 234 is applied, via signal 235, to the mux-select terminal 206a of shifter-multiplexer 206, causing shifter-multiplexer 206 to provide the 48 bits beginning with the bit identified in signal 235.

The value in register 236 is applied, via signal 237, to the input of a sum generating block 218. The purpose of the sum generating block 218 is to calculate the next starting bit position within shifter-multiplexer 206 for the third and fourth encoded data values in the DATA_IN data stream (i.e., the two values that immediately follow the first and second encoded data values). This calculation is performed in parallel with the length decoding operation performed by length decoder 210 and the second length decoding means 212. The sum generating block 218 includes a plurality of adders $220_1$–$220_{40}$. Each adder $220_1$–$220_{40}$ corresponds to a respectively different value of the combined length 215 (i.e., a respective adder for each possible value of a combined length). Each adder simultaneously forms a respective candidate shift control signal. Each adder adds a respectively different constant to the position of the first encoded data value during the same clock cycle in which length decoders 212a–212p decode the length of the second encoded data value (Advantageously, adder complexity is reduced, because each adder adds only a single constant). Thus, 40 different candidate positions are simultaneously calculated, one for each possible combined length. The respective constant in each adder is the combined length to which that adder corresponds. Each adder performs a modulo 48 addition. The output of each adder is a seven bit signal $221_1$–$221_{40}$. The six LSBs of the adder output signal identify the modulo 48 sum calculated by the adder; the most significant bit (MSB) is a flag that is set when the sum is greater than or equal to 48. The output signals $221_1$–$221_{40}$ of the adders $220_1$–$220_{40}$ are transmitted to a sum selector function 222.

When the MSB 238 of the output signal 223 of sum selector 222 is set to one, the MSB of the second encoded data value is located within the 48 MSBs of shifter-multiplexer 206. To keep shifter-multiplexer 206 full of data that have not yet been decoded, the MSB 238 of output signal 223 is used to enable the loading of new data from registers 202 and 204 into shifter-multiplexer 206. As noted above, the loading operation results in a downward shift of the data in shifter-multiplexer 206, so that what were previously the 47 MSBs are now the 47 LSBs. 48 additional bits of new data are moved into the MSB positions of shifter-multiplexer 206.

Sum selector 222 receives the 40 candidate shift control signals, representing 40 candidate positions. Sum selector 222 also receives the current mux position 237 from register 236 and an externally provided mux position 240, both of which are explained below. The output signal 215 of combined length decoder 214 is used to control sum selector 222. The single set bit of combined length signal 215 is used as an enable signal to enable transmission of the output of one of the adders $220_1$–$222_{40}$ from sum selector 222.

In the embodiment of FIG. 2, when the Intra DC coefficient is being processed in the first length decoder 210, the combined length decoder 214 outputs a combined length 215 equal to the length of the DC coefficient, so that the first and second AC coefficients are processed in the next cycle. Thus it is possible to decode the Intra DC coefficient length in a separate cycle to implement the second length decoding means 212 with only 16 decoders 212a–212p.

There are two situations in which none of the 40 output signals $221_1$–$221_{40}$ is selected by sum selector 222. First, when the system is initialized by transmitting the restart signal to control logic 216, control logic 216 issues a load external signal to sum selector 222, causing sum selector 222 to output the externally provided mux position 240. Control logic 216 is explained in greater detail below with reference to FIG. 3.

The other situation in which none of the adder output signals $221_1$–$221_{40}$ is used is when processing of the block is completed, and the end of block is detected. Control logic 216 issues the Bypass signal to sum selector 222. Sum selector 222 selects the current mux position 237 that is detected at the bypass input terminal 222a to be used as the output value 223. Thus, the shifter-multiplexer 206 remains in the current state without any further indexing.

Figure 3:
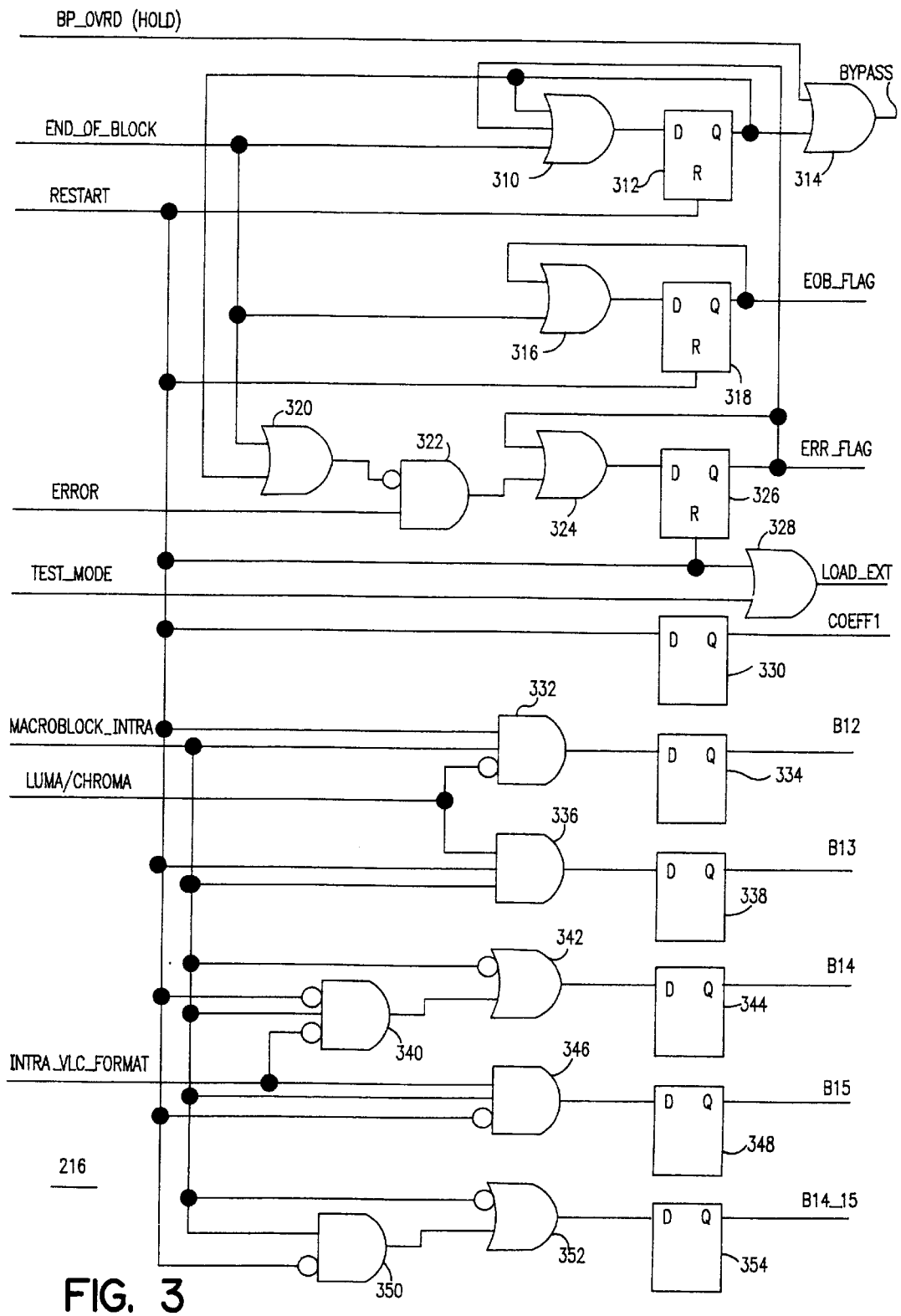
FIG. 3 is a block diagram of the control logic shown in FIG. 2.

FIG. 3 is a block diagram of exemplary logic for the VLD length decode control logic 216. Control logic receives several externally specified parameters, including: BP_OVRD (HOLD), RESTART, TEST_MODE, MACROBLOCK_INTRA, LUMA/CHROMA, and INTRA_VLC_FORMAT. The decoding function 208 provides control logic 216 with an indication of whether an End of Block or error condition has been detected. Control Logic 216 identifies the following parameters to the decoders 210 and 212a–212p: (1) whether the coefficient is a DC coefficient or other type; and (2) which of the coefficient tables B12–B15 is used for the first and second encoded value.

OR gate 314 sets the BYPASS flag to a logic high state if the BP_OVRD (HOLD) signal is set to the logic high state, an end of block is detected (END_OF_BLOCK is in the logic high state), an error is detected (ERR_FLAG is in the logic high state), or if the BYPASS flag was previously set to the logic high state. Once the BYPASS flag is set to the logic high state, it remains in that state until the RESTART signal is set to logic high. The BYPASS flag is transmitted to sum selector 222 (shown in FIG. 2), and causes the shifter-multiplexer 206 to remain in the same state until the RESET signal is set to the logic high state.

When the END_OF_BLOCK signal is in the logic high state, OR gate 316 sets the flip-flop 318 (EOB_FLAG output) to the logic high state, and flip-flop 318 remains in that state until the RESTART signal is set to the logic high state. The END_OF_BLOCK signal is provided to the output controller 140 (shown in FIG. 1).

OR gate 324 sets the D terminal of flip-flop 326 to logic high (to set the ERR_FLAG signal to logic high) when the ERROR signal is in the logic high state, and neither the END_OF_BLOCK signal nor the BYPASS output of flip-flop 312 is in the logic high state. The ERR_FLAG signal is provided to the output controller 140 (FIG. 1). Once the ERR_FLAG has been set to the logic-high state, it remains logic-high until flip-flop 326 is reset by the RESTART signal.

OR gate 328 outputs a LOAD_EXTERNAL signal having the logic high state when either the TEST_MODE or the RESTART signal is in the logic high state The LOAD_EXTERNAL signal is provided to the sum selector 222 (shown in FIG. 2). When the LOAD_EXTERNAL signal is in the logic high state, an externally specified mux position is used by shifter-multiplexer 206 (shown in FIG. 2).

The D terminal of flip-flop 330 is set to the logic high state (setting the COEFF_1 signal to the logic high state) when the RESTART is in the logic high state. The COEFF_1 signal is thus set to the logic high state at the start of a block processing operation, when a DC coefficient is being processed. The COEFF_1 signal is transmitted to length decoder function 210 (to configure decoder 210 for determining the length of the DC coefficient), and is also provided to the VLD Intra DC Coefficient Decode function 130.

AND gate 332 sets the D terminal of flip-flop 334 to the logic high state, to set the B12 output signal to the logic high state, when the RESTART and MACROBLOCK_INTRA signals are in the logic high state and the LUMA/CHROMA signal is in the logic low state. This occurs when processing the first (DC) coefficient of an intra-coded luminance block. The B12 signal is transmitted to the length decoder 210 (FIG. 2).

AND gate 336 sets the D terminal of flip-flop 338 to the logic high state, to set the B13 flag to the logic high state, when the RESTART, MACROBLOCK_INTRA and the LUMA/CHROMA signals are all in the logic high state. This occurs when processing the first (DC) coefficient of an intra-coded chrominance block. The B13 signal is transmitted to the length decoder 210 (FIG. 2).

The logic components numbered 340–354 in FIG. 3 implement the "Selection of DCT coefficient VLC tables" as specified in Table 7–3 of the MPEG Standard. OR gate 342 sets the D terminal of flip-flop 344 to the logic high state, to set the B14 flag to the logic high state, when the MACRO_BLOCK_INTRA flag is in the logic low state, or if MACRO BLOCK_INTRA is logic high and RESTART and INTRA_VLC_FORMAT are both in the logic low state. This sets the B14 flag so the decoders 212a–212p use the B14 table for coefficients of blocks that are not intra-coded, and for coefficients of intra-coded blocks, other than the DC coefficient, for which the INTRA_VLC_FORMAT value is zero.

AND gate 346 sets the D terminal of flip-flop 348 to the logic high state, to set the B15 flag to the logic high state, when the MACRO_BLOCK_INTRA flag and INTRA_VLC FORMAT flag are in the logic high state, and RESTART is in the logic low state. This sets the B15 flag so the decoders 212a–212p use the B15 tables for coefficients (other than the DC coefficient) of intra-coded blocks for which the INTRA_VLC_FORMAT value is one.

OR gate 352 sets the D terminal of flip-flop 354 to the logic high state, to set the B14 _B15 flag to the logic high state, when either the MACROBLOCK_INTRA flag is set to logic low, or when the MACROBLOCK_INTRA flag is set to logic high and the RESTART signal is set to logic low. Thus, the B14 _B15 flag is set to the logic high state whenever the decoders 212a–212p should use either the B14 or B15 tables (i.e., for non intra-coded macroblocks and for the AC coefficients of intra-coded macroblocks).

Figure 4:
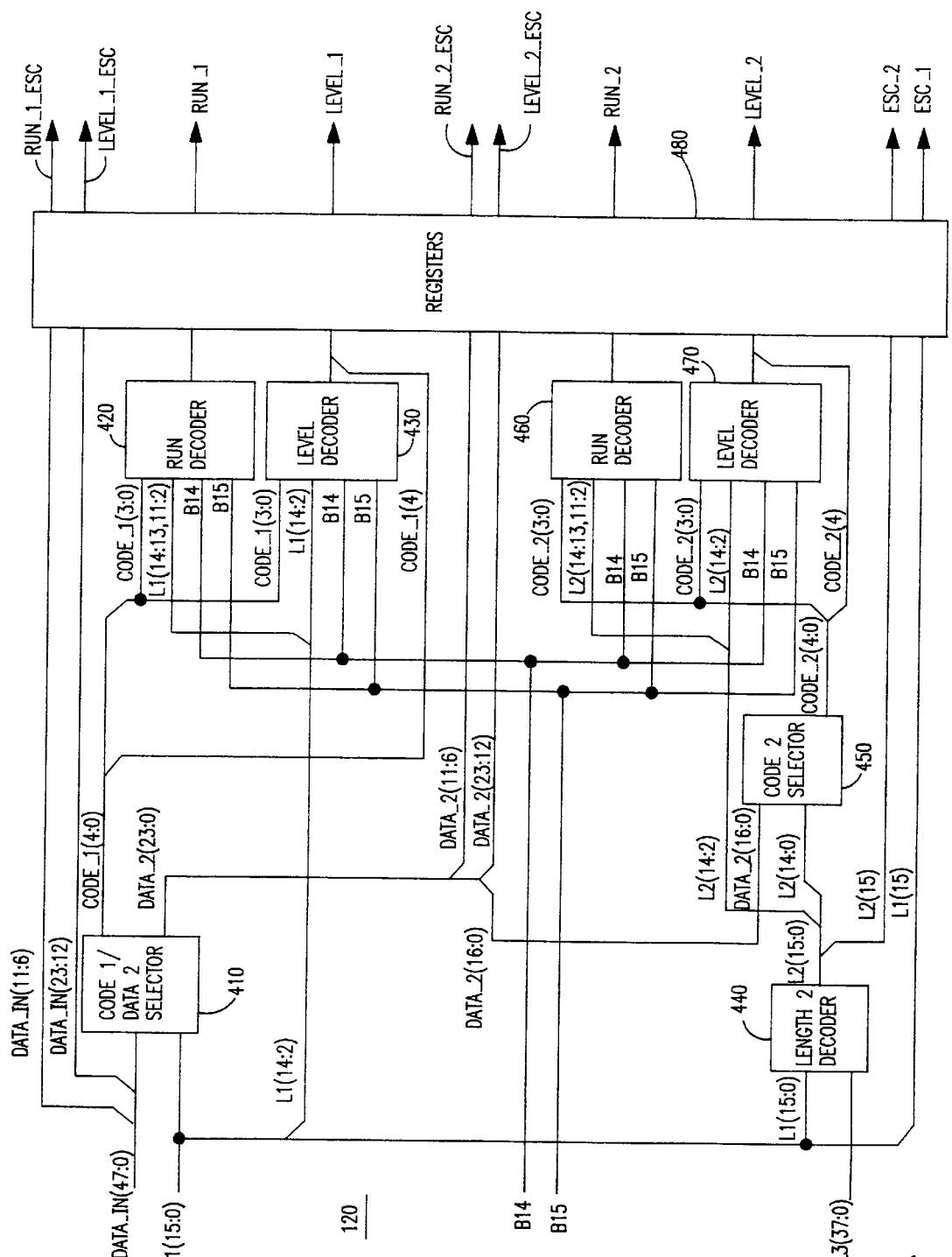
FIG. 4 is a block diagram of the Run/Level decoder shown in FIG. 1.

FIG. 4 is a block diagram of the exemplary VLD Run/Level Decoder 120 shown in FIG. 1. Because a separate function (VLD Intra DC Coefficient Decoder 130) is used for the DC coefficient, block 120 does not process the DC coefficient in the case of an Intra coded block. The circuitry need only process codes having lengths 2–11, 13–17 and 24. The respective Run/Level decoding circuits for the first and second encoded data values within VLD Run/Level Decode function 120 are very similar, with a few minor differences explained below. Thus, only 16 bits (bits 0–9, 11–15 and 19) of the L1 signal (shown in FIG. 1) are used; these 16 bits are indicated by L1(15:0) in the upper left corner of FIG. 4.

A Code1/Data 2 selector 410 processes the length L1 of the first code. If the length L1 is 24 bits (i.e., if the last bit of the 16 bit signal is set), then the first value is escape coded. The last bit of the 16 bit L1 signal is output as the ESC_1 signal. For an escape coded value, the first six bits indicate the escape code, the next six bits are the Run value, and the last 12 bits are the level value. Thus, when the length is 24 bits, the ESC_1 flag is set to the logic high value. Bits No. 6–11 of the DATA_IN signal (the 7th through the 12th bits) are transmitted as the RUN_1_ESC value, which is output by output mux 150 (FIG. 1) when the ESC_1 flag is set. Bits No. 12–23 of the DATA_IN signal (the 13th through the 24th bits) are transmitted as the LEVEL_1_ESC value, which is output by output mux 150 (FIG. 1) when the ESC_1 flag is set.

For all other VLCs (non escape-coded values), because the length of the VLC has already been identified by the (at most) 12 LSBs, it is possible to determine the run and level using at most 5 bits, as indicated by Code_1(4:0) and Code_2(4:0) in FIG. 4. For example, in Table B-14, there are 16 VLCs that are 17 bits long. All 16 of these VLCs have the same 12 LSBs, and the next five bits identify respectively different combinations of run and level values for each of the 17 bit VLCs.

The 5 bits of Code_1(4:0) are transmitted to Run Decoder 420 and Level Decoder 430. The decoders 420 and 430 contain LUTs which store the run and level values, from Tables B-14 and B-15. When the B14 signal has a logic high value, the B14 table is to be used; when the B15 signal has a logic high value, the B15 table is to be used (as described above with reference to FIGS. 2 and 3). Given the Code_1(4:0) bits, L1, and the B14 and B15 signals, Run decoder 420 and level decoder 430 determine the run and level, respectively.

Code 1/Data 2 selector 410 also parses out the second encoded data value Data_2 (based on the L1 value), and transmits:

(1) the first 17 bits [i.e., Data_2(16:0)] of the second encoded data value Data_2 to the Code 2 selector 450;

(2) the 7th through 12th bits of Data_2 [i.e., Data_2(11:6)] to registers 480 for transmission as the RUN_2_ESC signal; and (3) the 13th through 24th bits of Data_2 [i.e., Data_2(23:12)] to registers 480 for transmission as the LEVEL_2_ESC signal.

VLD Run/Level Decoder 120 includes a Length 2 decoder 440, which processes the L1 (15:0) signal and the L3(37:0) combined length, to determine the length of the second encoded data value. Because L1 and L3 are each provided in the form of a multiple bit signal, with a single bit set to a value of "one," the length 2 decoder 440 can use logic gating instead of a subtracter to efficiently identify the length of the second encoded data value and output that length in the form of a 16 bit value having only a single bit set to the value, "one." In the same way as Code 1/data 2 selector 410, the 16th bit L2(15) is set to the logic low state for a 24 bit encoded data value, which is escape coded. One of ordinary skill in the art could readily construct length 2 decoder 440.

A Code2 selector processes the L2 signal in the same way that selector 410 does, to parse out the five bits Data_2(4:0) that are needed to identify the run and level for non escape-coded values. Code2 selector transmits the Code2 (4:0) values to run decoder 460 and level decoder 470, the same way Code1 selector 410 transmits this information to decoders 420 and 430. Run decoder 460 and level decoder 470 are identical to run decoder 420 and level decoder 430, and the description thereof is not repeated herein.

Figure 5:
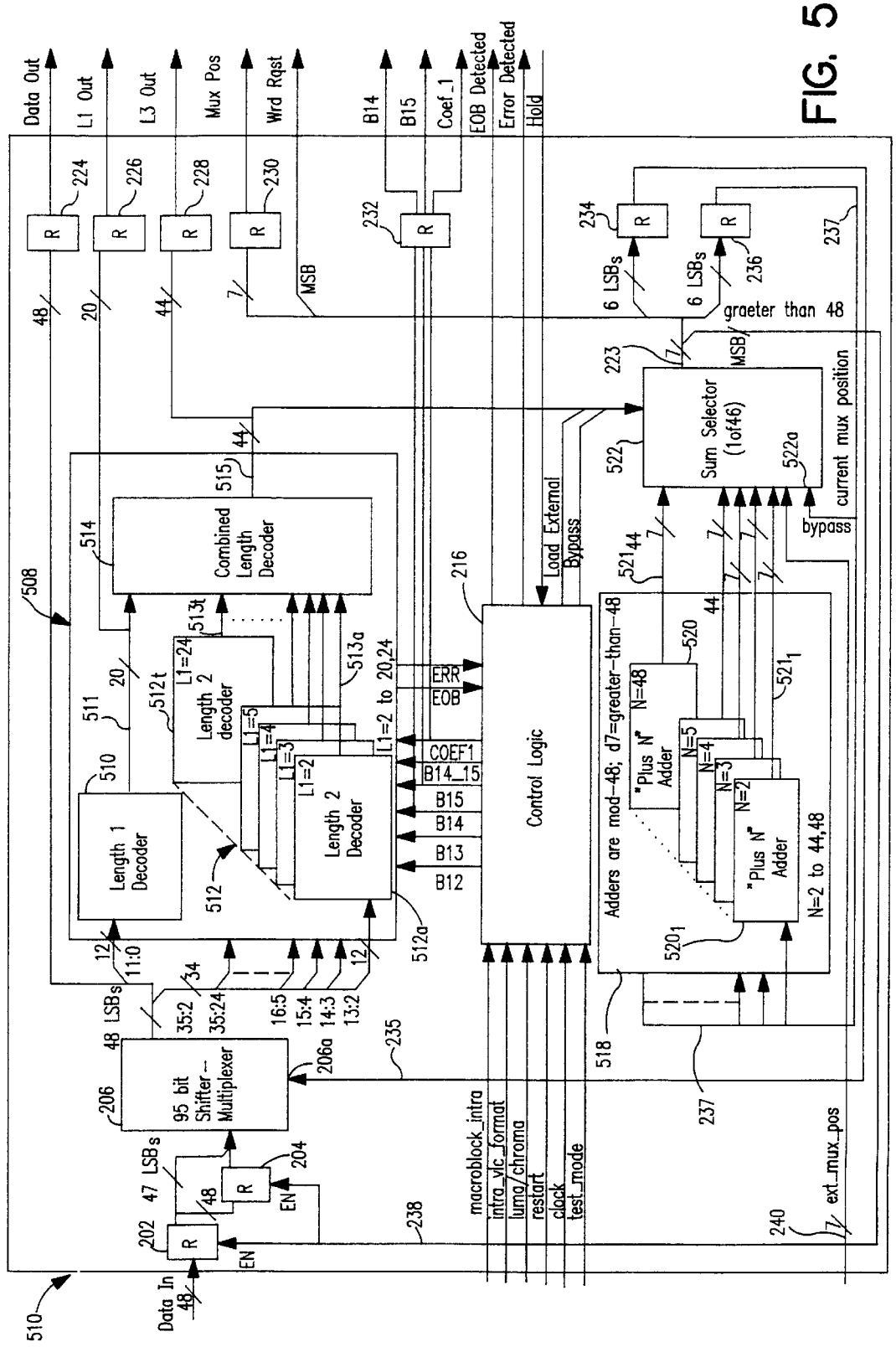
FIG. 5 is a block diagram of a second exemplary VLD length decode loop usable in the Variable Length Decoder shown in FIG. 1.

FIG. 5 is a block diagram of a second exemplary length decode function 510. Components and signals in FIG. 5 that are the same as those in FIG. 2 have the same reference numerals and are not described again.

Length decode function 510 is capable of decoding the length of the Intra DC Coefficient in the Length 1 decoder 510 at the same time that the first AC coefficient is being decoded in the second length decoding means 512. To provide this capability, extra decoders 512q–512t are provided, so that the second length decoding means 512 includes a length decoder for each possible length of an Intra DC coefficient (2–4, 6–20) or an AC coefficient (2–11, 13–17 or 24). That is, there are twenty decoders 512a–512t, for all the possible lengths (2–20 or 24) of the first encoded value, whether the first value represents a DC or an AC coefficient.

In this configuration, the combined length L3 may assume 44 values, corresponding to combined lengths of 2–44 and 48. Thus, 44 adders $520_1$–$520_{44}$ are provided (instead of the 40 adders in FIG. 2), corresponding to these 44 possible combined lengths. Thus Sum Selector 522 must select one of 46 values (44 possible lengths, bypass, or externally provided position).

The Variable Length Decoder has been described herein in terms of an exemplary DCT coefficient length decoder. A circuit configuration (not shown) similar to Coefficient Decoder 100 (FIG. 1) may be used to decode high level syntax elements, as defined in paragraphs 6.1 through 6.13 of the MPEG Standard. When the end of block is reached in coefficient decoder 100, the BYPASS flag (described above with reference to FIG. 3) is set to logic high, and control is transferred to the high level syntax decoder, along with the location of the next code. Then, when the high level code is decoded, the RESTART signal is set to the logic high state to decode the next two DCT coefficients.

Furthermore, although the invention has been described in terms of an exemplary embodiment using the MPEG encoded video data bitstream, the invention may be practiced in other types of variable length decoders.

While the invention has been described with reference to exemplary embodiments, it is not limited thereto. Rather, the appended claims should be construed to include other variants and embodiments of the invention which may be made by those skilled in the art without departing from the true spirit and scope of the present invention.

What is claimed:

1. Apparatus for determining the lengths of a plurality of variable length encoded data values included in a data stream within a single clock cycle, the apparatus comprising:

shifting means for receiving the data stream and responsive to a shift control signal for transmitting a subset of the plurality of variable length encoded data values;

first length decoding means, coupled to receive the subset of the plurality of encoded data values for performing a first decoding operation to determine a length of a first one of the encoded data values in the subset;

second length decoding means, coupled to receive the subset of the plurality of encoded data values for performing a second decoding operation to individually determine a length of a second one of the encoded data values in the subset without decoding the length of the first encoded data value in the second length decoding means, the second encoded data value immediately following the first encoded data value in the subset, said first and second decoding operations being performed simultaneously;

combined length decoding means responsive to the lengths of the first and second encoded data values for outputting a combined length of the first and second data values; and shift controlling means, responsive to the combined length of the first and second data values, for forming the shift control signal so as to identify a position of a next encoded data value within the shifting means, said next encoded data value immediately following the second encoded data value, said shift controlling means transmitting the shift control signal to the shifting means.

2. Apparatus according to claim 1, wherein the second length decoding means include:

a respective length decoder for each possible length of the first encoded data value, each length decoder simultaneously decoding a respectively different portion of the subset of the plurality of encoded data values, wherein each length decoder simultaneously determines a respective value of the length of the second encoded data value, based on a corresponding possible length of the first encoded data value, and one of the length decoders decodes a single portion of the subset of the plurality of encoded data values, said single portion including the second encoded data value, said single portion excluding the first encoded data value.

3. Apparatus according to claim 2, wherein the first length decoding means generates and transmits a first length signal indicating the length of the first encoded data value, and each of the length decoders of the second length decoding means generates and transmits a respective output signal, the apparatus further comprising:

means responsive to the first length signal for selecting an output signal of the length decoder that corresponds to the length of the first encoded data value indicated by the first length signal, said selected output signal indicating the length of the second encoded data value.

4. Apparatus according to claim 2, wherein:

the first length decoding means outputs a respective bit for each possible length of the first encoded data value, a single one of the bits output by the first length decoding means is set, the set bit corresponding to the length of the first encoded data value determined by the first length decoding means, and each of the length decoders of the second length decoding means generates a respective output signal representing a length of the second encoded data value determined by the length decoder, and the combined length decoding means is responsive to the single set bit for enabling transmission of the output signal by the respective length decoder corresponding to the length of the first encoded data value for which the bit is set by the first length decoding means.

5. Apparatus according to claim 4, wherein the shift controlling means include a respective adder for each possible value of the combined length of the first and second encoded data values, each adder forming a respective candidate shift control signal;

the combined length decoding means outputs a respective bit for each possible combined length of the first and second encoded data values, one of the bits output by the combined length decoding means is set, the set bit corresponding to the combined length of the first and second encoded data, and the shift control means uses the set bit output by the combined length decoding means to enable transmission of the candidate shift control signal output by one of the adders, the one adder corresponding to the combined length of the first and second encoded data values.

6. Apparatus according to claim 1, wherein the shifting means include a shifter-multiplexer that receives the data stream and transmits a fixed number of data bits to the first and second length decoding means, and the shift control signal identifies a location of a first one of the fixed number of data bits within the shifter-multiplexer.

7. Apparatus according to claim 1, wherein the shift controlling means include:

a respective adder for each possible value of the combined length of the first and second encoded data values, each adder simultaneously forming and transmitting a respective candidate shift control signal, and sum selecting means responsive to the combined length of the first and second encoded data values for selecting the candidate shift control signal corresponding to the combined length of the first and second encoded data values, and for transmitting the selected candidate to the shifting means as the shift control signal.

8. Apparatus according to claim 7, wherein each adder performs a respective modulo arithmetic operation to form the candidate shift control signal of the adder.

9. Apparatus according to claim 8, wherein the shifting means include a shifter-multiplexer that receives the data stream and transmits a fixed number of consecutive data bits to the first and second length decoding means, and the shift control signal identifies a location of a first one of the fixed number of consecutive data bits within the shifter-multiplexer.

10. Apparatus according to claim 1, wherein the data stream comprises an encoded video signal, and the first and second encoded data values represent discrete cosine transform coefficients of the video signal.

11. Apparatus according to claim 1, wherein:

the first length decoding means include means for decoding an encoded data value having a maximum possible length for the first encoded data value, and the second length decoding means include means for decoding an encoded data value having a maximum possible length for the second encoded data value, whereby the apparatus is capable of decoding a pair of consecutive encoded data values having a combined length greater than either one of the group consisting of the maximum possible length for the first encoded data value and the maximum possible length for the second encoded data value.

12. Apparatus for decoding a data stream of variable length encoded data values within a single clock cycle, the apparatus comprising:

shifting means for receiving the data stream and responsive to a shift control signal for transmitting a subset of the plurality of variable length encoded data values;

first length decoding means, coupled to receive the subset of the plurality of encoded data values for performing a first decoding operation to determine a length of a first one of the encoded data values in the subset;

second length decoding means, coupled to receive the subset of the plurality of encoded data values for performing a second decoding operation to individually determine a length of a second one of the encoded data values in the subset without decoding the length of the first encoded data value in the second length decoding means, the second encoded data value immediately following the first encoded data value in the subset, said first and second decoding operations being performed simultaneously;

combined length decoding means responsive to the lengths of the first and second encoded data values for outputting a combined length of the first and second data values;

shift controlling means, responsive to the combined length of the first and second data values, for forming the shift control signal so as to identify a position of a next encoded data value within the shifting means, said next encoded data value immediately following the second encoded data value, said shift controlling means transmitting the shift control signal to the shifting means; and value decoding means, coupled to receive the subset of the plurality of encoded data values and the length of the first encoded data value and the combined length of the first and second encoded data values, for converting the first and second encoded data values into first and second decoded values, respectively.

13. Apparatus according to claim 11, wherein:

the first length decoding means include means for decoding an encoded data value having a maximum possible length for the first encoded data value, and the second length decoding means include means for decoding an encoded data value having a maximum possible length for the second encoded data value, whereby the apparatus is capable of decoding a pair of consecutive encoded data values having a combined length greater than either one of the group consisting of the maximum possible length for the first encoded data value and the maximum possible length for the second encoded data value.

14. A method for determining the lengths of a plurality of variable length encoded data values included in a data stream within a single clock cycle, comprising the steps of:

receiving the data stream and a shift control signal;

performing a first decoding operation in a first length decoder to determine a length of a first one of the encoded data values in the subset;

performing a second decoding operation in a second length decoder, to individually determine a length of a second one of the encoded data values in the subset without decoding the length of the first encoded data value in the second length decoder, the second encoded data value immediately following the first encoded data value in the subset, said first and second decoding operations being performed simultaneously;

outputting a combined length of the first and second data values;

forming the shift control signal to determine ones of the plurality of encoded data values that are included in the subset; and transmitting the shift control signal to the shifting means.

15. A method according to claim 14, wherein:

the first decoding operation includes decoding an encoded data value having a maximum possible length for the first encoded data value, and the second decoding operation includes decoding an encoded data value having a maximum possible length for the second encoded data value, whereby a pair of consecutive encoded data values is decoded, said pair having a combined length greater than either one of the group consisting of the maximum possible length for the first encoded data value and the maximum possible length for the second encoded data value.

* * * * *

UNITED STATES PATENT AND TRADE MARK OFFICE
CERTIFICATE OF CORRECTION

PATENT NO. : 5,841,380
DATED : November 24, 1998
INVENTOR(S) : Sita et al.

It is certified that error appears in the above-identified patent and that said Letters Patent is hereby corrected as shown below: On the title page: Item

[56] References Cited

The following references should be added:

U.S. PATENT DOCUMENTS

| | | |
|---|---|---|
| 5,432,512 | 7/1995 | Park |
| 5,561,690 | 10/1996 | Park |
| 5,280,349 | 1/1994 | Wang et al. |
| 5,572,208 | 11/1996 | Wu |
| 5,488,366 | 1/1996 | Wu |

Signed and Sealed this

Tenth Day of August, 1999

Attest:

Q. TODD DICKINSON

*Attesting Officer*      *Acting Commissioner of Patents and Trademarks*